United States Patent [19]

Van Dongen

[11] Patent Number: 4,866,723
[45] Date of Patent: Sep. 12, 1989

[54] DCPBH LASER HAVING A HIGH TEMPERATURE STABILITY

[75] Inventor: Teunis Van Dongen, Eindhoven, Netherlands

[73] Assignee: U.S. Philips Corp., New York, N.Y.

[21] Appl. No.: 237,939

[22] Filed: Aug. 29, 1988

[30] Foreign Application Priority Data

Sep. 18, 1987 [NL] Netherlands ............ 8702233

[51] Int. Cl.$^4$ .................................. H01S 3/19
[52] U.S. Cl. ................................ 372/46; 372/45
[58] Field of Search ............... 372/45, 46, 43, 44

[56] References Cited

U.S. PATENT DOCUMENTS 4,525,841  6/1985  Kitamura et al. .................. 372/46
4,597,085  6/1986  Mito et al. ......................... 372/46

FOREIGN PATENT DOCUMENTS 0133778  7/1985  Japan .............................. 372/43

Primary Examiner—William L. Sikes
Assistant Examiner—Georgia Y. Epps
Attorney, Agent, or Firm—Steven R. Biren

[57] ABSTRACT

A semiconductor laser of the double hetero-junction type has a current-limiting buried blocking layer with a second active layer and an additional passive layer provided above the first layer. As a result, the threshold current required for laser operation is less strongly dependent upon temperature. At the same time, the radiation intensity versus current strength characteristic of the laser above the threshold current is substantially straight, without the presence of "kinks".

3 Claims, 2 Drawing Sheets

DCPBH LASER HAVING A HIGH TEMPERATURE STABILITY

BACKGROUND OF THE INVENTION

The invention relates to a semiconductor laser having a semiconductor body comprising a substrate of a first conductivity type and a layer structure disposed thereon and comprising successively at least a first passive layer of the first conductivity type, a second passive layer of the second opposite conductivity type and an active layer located between the first and second passive layers and having a pn junction which can produce (at a sufficiently high current strength in the forward direction) coherent electro-magnetic radiation in a strip-shaped region of the active layer located within a resonant cavity, the first and second passive layers having a lower refractive index for the radiation produced and a larger band gap than the active layer, while a current-limiting blocking layer is provided, which at the area of the active region has a strip-shaped interruption, two grooves being provided on either side of the active region and extending from the upper side of the second passive layer through the active layer into the first passive layer, which grooves are at least partly filled by the blocking layer. Semiconductor lasers are important in many fields of technology and are used in many applications.

A semiconductor laser of the kind described above is generally known under the designation DCPBH (Double Channel Planar Buried Hetero-structure) laser and is disclosed in European patent application No. EP 0111650. A disadvantage of these lasers is a strong temperature dependence of the threshold current.

InGaAsP/InP double hetero-junction (DH) lasers in particular have strongly increasing threshold current values with increasing temperature. This is partly due to the fact that charge carriers enclosed in the active layer thermally leak away to the passive layers.

I.E.E.E. J. of Quantum Electronics (QE 19, August 1983, 1319–1326) discloses semiconductor lasers provided with an additional (second) active layer. These so-called DCC (Double Carrier Confinement) lasers have a high temperature stability for InGaAsP/InP lasers. A disadvantage of DCC lasers, however, is that they have a comparatively high threshold current value. For a DCC laser, the threshold current value is of the order of 100–300 mA, while for a DCPBH laser this value is of the order of 10–30 mA.

SUMMARY OF THE INVENTION

The invention has inter alia for its object to provide a semiconductor laser in which a low threshold current value is combined with a high temperature stability.

According to the invention, a semiconductor laser of the kind described above is characterized in that on the active layer below the second passive layer are provided first a third passive layer of the second conductivity type and then a second active layer also of the second conductivity type and having practically the same band gap as the first active layer.

It has further been found that by this measure a laser can be obtained whose radiation intensity versus current characteristic is very stable and has substantially no "kinks".

BRIEF DESCRIPTION OF THE DRAWING

The invention will now be described more fully with reference to several embodiments and the drawing, in which.

Figure 1:
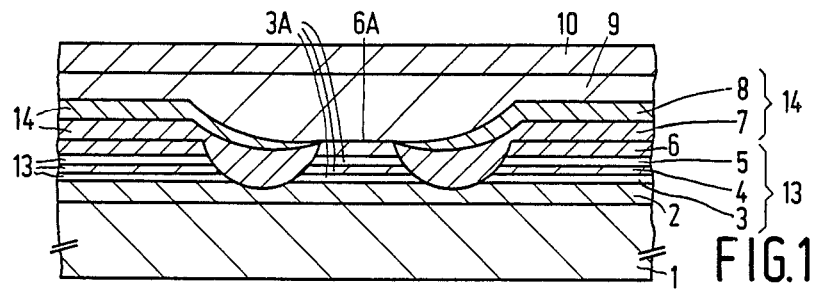
FIG. 1 shows diagrammatically in cross-section a semiconductor laser according to the invention.

The Figures are purely schematic and not drawn to scale. For the sake of clarity, the dimensions in vertical direction are greatly exaggerated. Corresponding parts are generally designated by the same reference numerals and regions of the same conductivity type are generally cross-hatched in the same direction.

DESCRIPTION OF THE PREFERRED EMBODIMENTS

Figure 5:
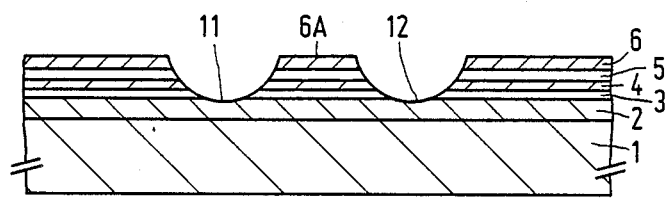

FIG. 1 shows diagrammatically in cross-section a semiconductor laser according to the invention. The laser comprises a semiconductor body having a substrate (1) in this embodiment of indium phosphide (InP) of a first (in this embodiment n) conductivity type. On the substrate is disposed a layer structure comprising successively a first passive layer (2) also of n-type InP, a second passive layer (6) of InP of the second opposite conductivity type, in this case p-type, and an active layer (3) located between the first (2) and the second (6) passive layer and consisting in this embodiment of indium gallium arsenic phosphide having the composition $In_xGa_{1-x}As_yP_{1-y}$. By varying the value of x and y, the wavelength of the radiation produced can be varied between approximately 1.2 and 1.6 μm. In this embodiment, x=0.73 and y=0.60; the wavelength is then approximately 1.3 μm. The active layer 3 is generally not intentionally doped. A pn junction is formed between the layer (3) and one of the passive layers (2) or (4). The pn junction can generate, at a sufficiently high current strength in the forward direction, about 30 mA coherent electromagnetic radiation, in this embodiment of $23.10^{13}$ Hz, in a strip-shaped region 3A located within a resonant cavity. The first (2) and second (6) passive layers have a lower refractive index, in this embodiment n=3.21, for the radiation produced and a larger band gap $E_g$=1.35 eV than the active layer (3), n=3.52 and $E_g$=0.953 eV (at 300 K.). A current-limiting blocking layer 14, comprising in this embodiment a layer (7) of InP of the second (p) conductivity type and a layer 8 (InP) of the first (n) conductivity type, has at the area of the active region (3A) a strip-shaped interruption, two grooves (11, 12) being provided on either side of the active region (3A) as shown in FIG. 5. When a voltage is applied across the semiconductor laser in the forward direction of the active region (3A), the pn junction between the layers (7) and (8) of the blocking layer is cut off.

The blocking layer 14 in this embodiment entirely fills the grooves (11) and (12), which extend from the upper side of the second passive layer (6) through the active layer (3) into the first passive layer (2).

According to the invention, the active region (3A) is composed of three layers (3), (4) and (5).

The active region (3A) is located below the second passive layer (6) and is constituted by the active layer (3), a third passive layer (4) of InP of the second conductivity type and a second active layer (5) also of the second conductivity type and having practically the same band gap as the active layer (3).

The second active layer (5) in this embodiment has the same composition as the first active layer (3). The layer (5) is of the second (in this embodiment p) conductivity type.

The active region (3A) forms with the first passive layer (2) a pn junction, which produces coherent electromagnetic radiation at current strengths above the threshold current. The active region (3A) in FIG. 1 extends at right angles to the plane of the drawing in both directions. The end faces of the active region (3A) lying in the plane of the drawing are cleavage surfaces having in this embodiment a (011) orientation and are to a certain extent reflecting for the radiation produced.

The first passive layer (2) and the second passive layer (6), like the blocking layer (14) at the area of the active region (13), are in this embodiment made of InP and have a lower refractive index and a smaller band gap than the active layers (3) and (5) of indium gallium arsenic phosphide. The radiation produced can thus not readily emanate from the active region (3A).

Figure 2:
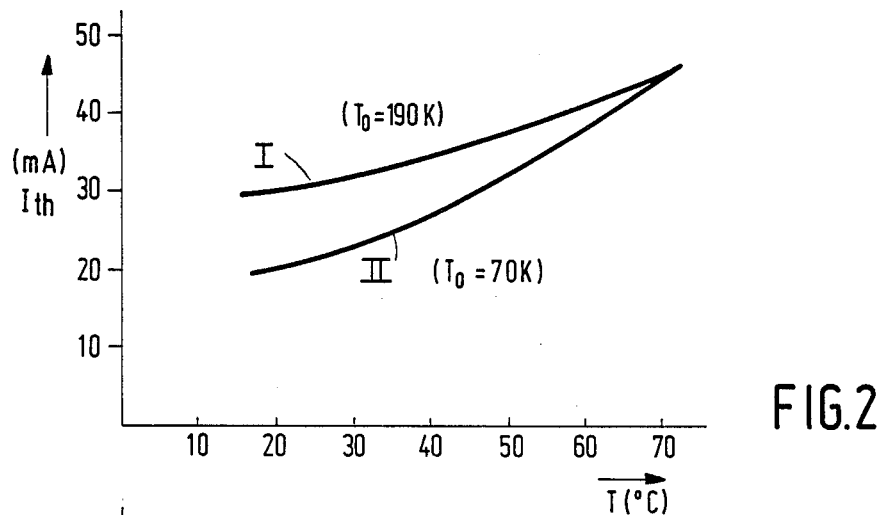
FIG. 2 shows the threshold current as a function of temperature for a semiconductor laser according to the invention and for a known semiconductor laser having the same structure, but without a double active layer.

The threshold current $I_{th}$ required for laser effect has become less dependent upon the temperature T due to the presence of the second active layer (5) (cf. FIG. 2). It is common practice (see, for example, "Semiconductor lasers and hetero-junction LED's", H. Kressel and J. K. Butler, Academic Press, New York, 1977) to approach the temperature dependence of the threshold current with the formula $I_{th} \sim e^{T/T_0}$, the parameter $T_0$ depending upon the laser type. For conventional DCPBH lasers it holds that 40 K.$<T_0<$80 K., while considerably higher $T_0$ values are found for the laser according to the invention ($T_0>$100 K.). High $T_0$ values cause the threshold current to become less dependent upon temperature, as clearly appears from FIG. 2.

The strongly increased temperature stability of the laser according to the invention is associated in comparison with a DCPBH laser with only a small increase of the threshold current at lower temperatures.

Figure 3:
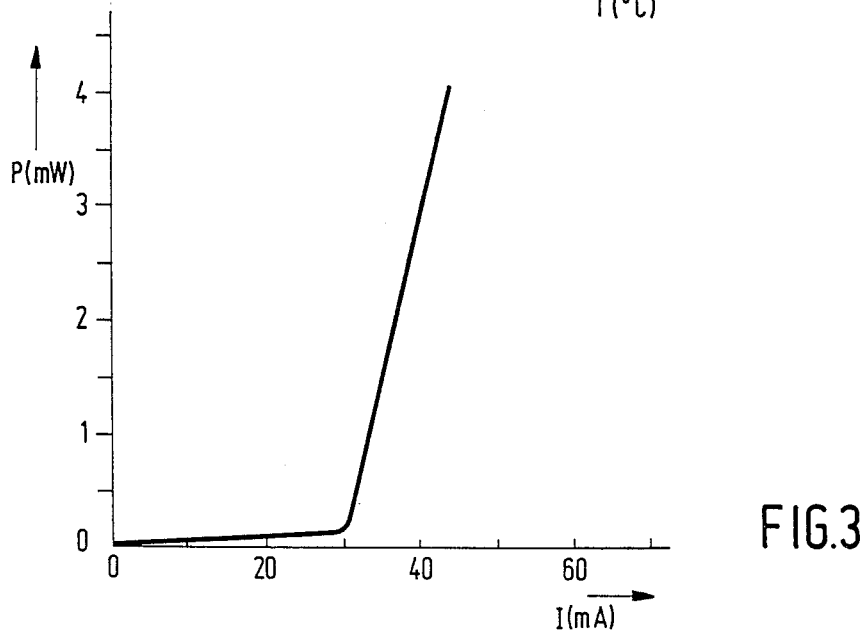
FIG. 3 shows the radiation intensity as a function of the current strength for a semiconductor laser according to the invention.

FIG. 3 shows the radiation intensity P versus the current strength I at 20° C. The threshold current $I_{th}$ is about 30 mA and from this value the characteristic is stable and free of kinks.

Figure 4:
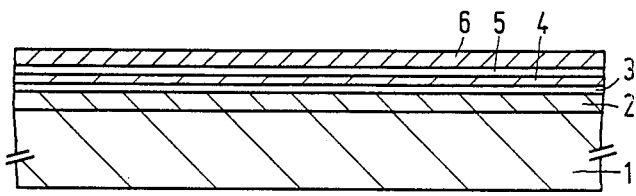
FIGS. 4 to 6 show diagrammatically in cross-section successive stages in the manufacture of the laser shown in FIG. 1.
Figure 6:
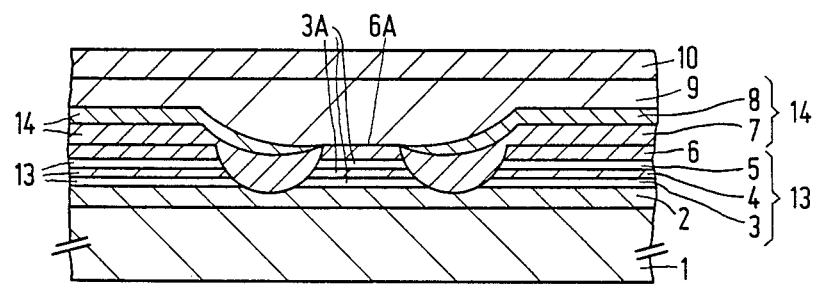

The semiconductor laser described may be manufactured, for example, in the manner indicated in FIGS. 4 to 6. On an n-type substrate (1) of indium phosphide (InP) having a thickness of, for example, approximately 350 nm, a (100) orientation with a deviation of about 0° 12" from the (100) direction and having a doping of, for example, sulphur atoms in a concentration of $5.10^{18}$ at/cm³ are successively grown in a usual manner by epitaxy from the liquid phase (LPE) a first passive layer (2) of n-type InP having a thickness of 2 μm and a doping of $5.10^{17}$ tin at/cm³, a first active layer (3) without doping an having the composition $In_{0.73}Ga_{0.27}As_{0.6}P_{0.4}$ and a thickness of 0.1 μm, a third passive layer (4) of p-type InP having a thickness of 0.1 μm and a doping of $1.5.10^{18}$ zinc at/cm³, a second p-type active layer (5) having the same composition as the first active layer (3), a thickness of 0.1 μm and a doping of $1.5.10^{18}$ zinc at/cm³ and a second passive layer (6) of p-type InP having a thickness of 1 μm and a doping of $2.10^{18}$ zinc at/cm³ (cf. FIG. 4).

After these layers have been provided, grooves (11) and (12) are etched into the surface with the use of, for example, bromomethanol as an etchant (cf. FIG. 5). The grooves have at the upper side a width of about 10 μm and a depth of 2 μm. The MESA (6A) located between the grooves has at the upper side a width of about 1 μm.

Subsequently, the blocking layer (14) consisting of a layer of p-type InP (7) having a doping of $1.10^{18}$ zinc at/cm³ and a layer of n-type InP (8) having a doping of $1.5.10^{18}$ germanium at/cm³ are grown, also by liquid phase epitaxy (cf. FIG. 6). On the flat part outside the MESA (6A) and the grooves, the layers (7) and (8) have a thickness of 1.0 and 0.8 μm, respectively. As is known, in such a growing process, the grooves (11) and (12) are filled, while no noticeable growth takes place on the MESA (6A).

Finally, a layer of p-type InP (9) having in the flat part a thickness of about 1 μm and a doping of $1.5.10^{18}$ zinc at/cm³ and a contact layer of p-type InP (10) having a thickness of about 0.4 μm and a doping of $1.10^{18}$ zinc at/cm³ are grown.

FIG. 2 shows the temperature dependence of the threshold current of the semiconductor laser according to the invention described above as well as of the known DCPBH laser without a second active layer, but otherwise having the same construction and structure.

It appears from the values found that for the laser (I) according to the invention $T_0=$190 K., while for the known laser (II) it holds that $T_0=$70 K. Even higher $T_0$ values for the laser according to the invention can be obtained with other doping concentrations of the different layers 2, 4, 5 and 6 (see the Table below), the layer thicknesses and compositions being the same as in the embodiment described.

| layer 2 at/cm³ | layer 4 at/cm³ | layer 5 at/cm³ | layer 6 at/cm³ | To K |
|---|---|---|---|---|
| $5 \times 10^{17}$ Sn | $1.5 \times 10^{18}$ Zn | $1.5 \times 10^{18}$ Zn | $1.5 \times 10^{18}$ Zn | 190 |
| $8 \times 10^{17}$ Sn | $1.5 \times 10^{18}$ Zn | $1.5 \times 10^{18}$ Zn | $1.5 \times 10^{18}$ Zn | 320 |
| $8 \times 10^{17}$ Sn | $2 \times 10^{18}$ Zn | $2 \times 10^{18}$ Zn | $2 \times 10^{18}$ Zn | 450 |

The layer structure indicated in the embodiment described may be varied in many ways. For example, especially the blocking layer (14), but also other layers may consist of several juxtaposed sublayers.

The conductivity types of the various semiconductor layers may be inverted and the semiconductor materials used may be varied by those skilled in the art in accordance with the application and the radiation frequency to be produced.

The end faces of the active region (3A) may be, instead of cleavage surfaces of the crystal, side faces provided by etching or in a different manner, while the resonant cavity may be constituted, instead of by (cleavage) end faces, by raster structures usual for lasers of the DFP (Distributed Feed-Back) of DBR (Distributed Bragg Reflector) type.

What is claimed is:

1. In a semiconductor laser, a semiconductor body comprising a substrate of a first conductivity type and a layer structure disposed thereon and comprising at least a first passive layer of the first conductivity type, a second passive layer of the second opposite conductivity type, a resonant cavity, and a strip-shaped active region located between the first and second passive layers and having a pn junction which can generate coherent electromagnetic radiation in operation at a sufficiently high current strength in the forward direction in a portion of said stip-shaped active region located within the said resonant cavity, the first and second passive layers having a lower refractive index for the generated radiation and a larger band gap than that of the active region and a current-limiting blocking layer which has, at the area of the active region, a strip-shaped interruption, two grooves being provided in said active region on either side of said active region portion and extending from the upper side of the second passive layer through the active region, which grooves are filled at least in part by the blocking layer, characterized in that the active region below the second passive layer comprises successively a first active layer, a third passive layer of the second conductivity type and a second active layer also of the second conductivity type and having substantially the same band gap as that of the first active layer.

2. A semiconductor laser as claimed in claim 1, characterized in that the strip-shaped active region is laterally bounded by a boundary region of the second conductivity type having a lower refractive index for the radiation produced and a larger band gap than that of the active layer.

3. A semiconductor laser as claimed in claim 1 or 2, characterized in that the first, second and third passive layers primarily comprise InP and the first and second active layers primarily comprise indium gallium arsenic phosphide ($In_xGa_{1-x}As_yP_{1-y}$).

* * * * *